United States Patent
Grebennikov et al.

(10) Patent No.: US 10,187,015 B2
(45) Date of Patent: Jan. 22, 2019

(54) DOHERTY AMPLIFIER

(71) Applicant: SUMITOMO ELECTRIC DEVICE INNOVATIONS, INC., Yokohama-shi (JP)

(72) Inventors: Andrey Grebennikov, Herts (GB); James Wong, Surrey (GB); Naoki Watanabe, London (GB)

(73) Assignee: SUMITOMO ELECTRIC DEVICE INNOVATIONS, INC., Yokohama-shi (JP)

(*) Notice: Subject to any disclaimer, the term of this patent is extended or adjusted under 35 U.S.C. 154(b) by 0 days.

(21) Appl. No.: 15/827,541

(22) Filed: Nov. 30, 2017

(65) Prior Publication Data
US 2018/0152149 A1    May 31, 2018

Related U.S. Application Data

(60) Provisional application No. 62/427,931, filed on Nov. 30, 2016.

(51) Int. Cl.
| | |
|---|---|
| *H03F 1/07* | (2006.01) |
| *H03F 1/02* | (2006.01) |
| *H03F 3/21* | (2006.01) |
| *H03F 3/30* | (2006.01) |

(52) U.S. Cl.
CPC .......... *H03F 1/0288* (2013.01); *H03F 3/211* (2013.01); *H03F 3/305* (2013.01); *H03F 2200/405* (2013.01)

(58) Field of Classification Search
CPC ................................. H03F 1/07; H03F 1/0288
USPC ............................................. 330/295, 124 R
See application file for complete search history.

(56) References Cited

U.S. PATENT DOCUMENTS

| | | | | |
|---|---|---|---|---|
| 8,035,444 | B2 * | 10/2011 | Okubo | H03F 1/0288 330/124 R |
| 2008/0284509 | A1 | 11/2008 | Kim et al. | |
| 2010/0289571 | A1 * | 11/2010 | Hong | H03F 1/0288 330/124 R |
| 2013/0265107 | A1 | 10/2013 | Holmes | |
| 2014/0097903 | A1 * | 4/2014 | Aoki | H03F 1/0288 330/295 |

FOREIGN PATENT DOCUMENTS

EP    2403135 B1    1/2012

* cited by examiner

*Primary Examiner* — Henry Choe
(74) *Attorney, Agent, or Firm* — Venable LLP; Michael A. Sartori; Miguel A. Lopez

(57) ABSTRACT

An inverted symmetrical four-stage Doherty amplifier is disclosed. The Doherty amplifier includes a carrier amplifier and a plurality of peak amplifiers. Outputs of the carrier amplifier and the peak amplifiers are provided to the combining unit through the offset unit including offset transmission lines each connected with the carrier amplifier and the peak amplifiers. The offset transmission lines have characteristic impedance and electrical lengths equal to each other such that the impedance seeing the amplifiers at the ends of the offset transmission lines become substantially short-circuited.

6 Claims, 6 Drawing Sheets

DOHERTY AMPLIFIER

CROSS REFERENCE TO RELATED APPLICATION

This application claims the priority under 35 U.S.C. § 119 of U.S. Provisional Application Ser. No. 62/427,931, filed on Nov. 30, 2016, the contents of which is relied upon and incorporated herein by reference in its entirety.

BACKGROUND OF INVENTION

1. Field of the Invention

The present invention relates to a Doherty amplifier, in particular, to a Doherty amplifier implementing a plurality of peak amplifiers.

2. Related Background Arts

Although most communication systems request consistency between high efficiency and a superior linearity, they usually show a relation of a trade-off. Besides various standards, such as GSM (Global System for Mobile Communication), which is the second generation standard in the mobile communication system and EDGE (Enhanced Data GSM Environment) extended from the GSM and belongs in the third generation system; or WCDMA (Wideband Code Division Multiple Access) of the fourth generation system and LTE (Long Term Evolution) belonging in the four generation system, generally requests a wide dynamic range in the output power of the power amplifier. When a power amplifier is designed so as to show a maximum efficiency at a maximum output power; such an amplifier drastically degrades the efficiency thereof at lower output power. Accordingly, it would be hard to realize in a power amplifier for a base station that the consistency between the efficiency and the linearity not only at a maximum output power but at a power backed-off from the maximum output power by −6 dB with a digitally control and a low cost.

One possible solution for such a subject is to implement a plurality of peak amplifiers in a Doherty amplifier. However, an output combiner for such a Doherty amplifier with a plurality of peak amplifiers inevitably becomes complex. In particular, in a case where the output combiner directly combines outputs of the peak amplifiers that are turned off at lower output power, the peak amplifiers are not occasionally regarded to be turned off because of parasitic capacitances and inductances attributed to the peak amplifiers. The output combiner assuming that the peak amplifiers are turned off at lower output power sometimes does not show designed performances and the Doherty amplifier may degrade the efficiency thereof.

SUMMARY OF INVENTION

An aspect of the present invention relates to a Doherty amplifier that includes a carrier amplifier and a plurality of peak amplifiers. The Doherty amplifier of the invention provides an input splitter, an amplifying unit, an offset unit, and an output combiner. The input splitter evenly distributes an input radio frequency (RF) signal to the carrier amplifier and the plurality of peak amplifiers. The amplifying unit includes the carrier amplifier and the plurality of peak amplifiers. The offset unit includes a plurality of offset transmission lines each connected with an output of the carrier amplifier and outputs of the peak amplifiers. The output combiner combines outputs of the carrier amplifier and the peak amplifiers each provided through the offset transmission lines. A feature of the Doherty amplifier of the present invention is that the offset transmission lines have characteristic impedance and electrical lengths substantially equal to each other such that the offset transmission lines convert output impedance of the peak amplifiers into a short-circuit when the peak amplifiers are turned off.

BRIEF DESCRIPTION OF THE DRAWINGS

The invention will now be described by way of example only with reference to the accompanying drawings in which.

DESCRIPTION OF EMBODIMENT

Next, embodiment of Doherty amplifiers according to the present invention will be described as referring to accompanying drawings. In the description of the drawings, numerals or symbols same with or similar to each other will refer to elements same with or similar to each other without duplicating explanations. Also, the present invention does not restricted in the embodiment, and is intended that the scope of the invention be defined by the claims appended hereto and their equivalents.

Figure 1:
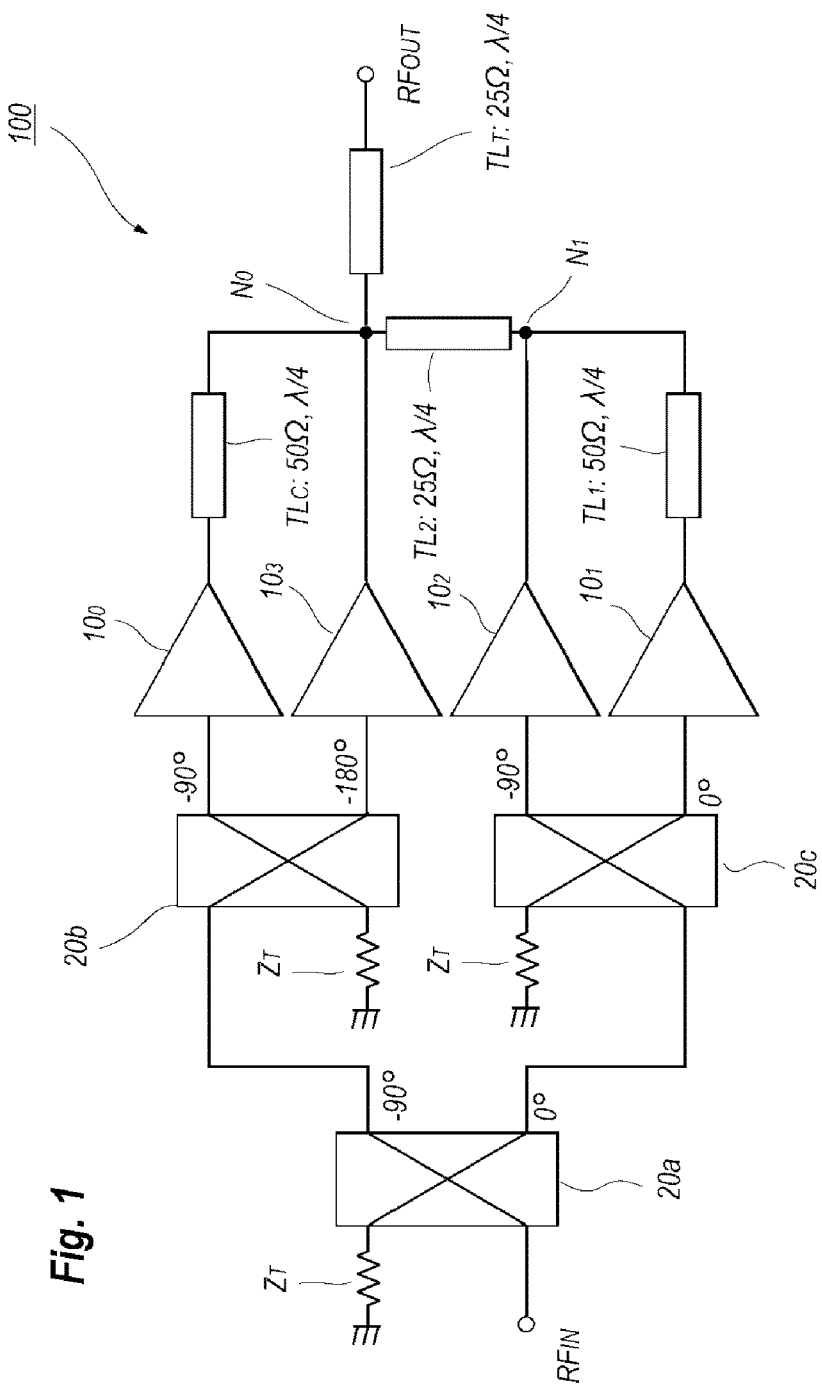
FIG. 1 shows a functional block diagram of a conventional Doherty amplifier.
Figure 2:
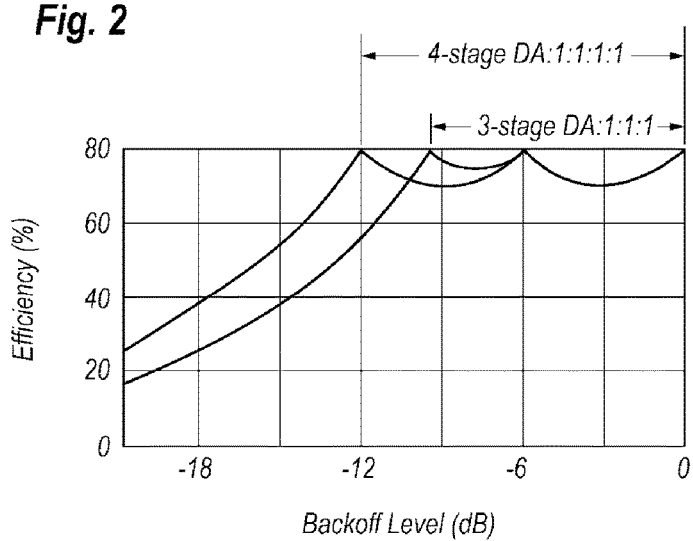
FIG. 2 schematically illustrates relation between the efficiency and the output power for three- and four-stages Doherty amplifiers.

FIG. 1 shows a functional block diagram of a conventional Doherty amplifier with a symmetrical arrangement that is disclosed in a European patent issued as 2,403,135B, and FIG. 2 schematically illustrates a relation between the efficiency and the output power for three- and four-stage Doherty amplifiers, where the symmetrical arrangement of a Doherty amplifier means that a carrier amplifier and one or more peak amplifiers have a same configuration. The Doherty amplifier 100 shown FIG. 1 includes a carrier amplifier $10_0$ and peak amplifiers, $10_1$ to $10_3$, and outputs of those amplifiers are combined through transmission lines, $TL_C$ to $TL_2$, each having electrical lengths of $\lambda/4$, where $\lambda$ is a wavelength of a signal subject to the Doherty amplifier 100 and provided in an input terminal $RF_{IN}$.

When the Doherty amplifier 100 outputs maximum power, namely, saturated power, the carrier amplifier $10_0$ and the peak amplifiers, $10_1$ to $10_3$, are all turned on; while, when the output power is smaller at least 12 dB than the saturated power, only the carrier amplifier $10_0$ activates and the all peak amplifiers, $10_1$ to $10_3$, turn off. The outputs of the peak amplifiers, $10_1$ to $10_3$, may be regarded as open circuits, which means that the node $N_1$ may be regarded as a short circuit and impedance seeing from the node $N_1$ the node $N_0$ becomes an open circuit. When the output terminal $RF_{OUT}$ is terminated by 50Ω, the load impedance of the carrier amplifier $10_0$ becomes $50^2/(25^2/50)=200Ω$.

When the output power exceeds the back-off level but is still smaller at least 6 dB from the saturated power, the carrier amplifier $10_0$ and the first peak amplifier $10_1$ turn on, the load impedance of the carrier amplifier $10_0$ and that of the first peak amplifier $10_1$ each become 100Ω, which makes the impedance at the node $N_0$ to be 12.5Ω and the impedance matching at the output terminal $RF_{OUT}$ is realized. Further increasing the output power at the output terminal $RF_{OUT}$, the second peak amplifier $10_2$ also turns on. The load impedance of the carrier amplifier $10_0$ becomes 67Ω, and the load impedance of the first peak amplifier $10_1$ and that of the second peak amplifier $10_2$ at the node N1 becomes 33Ω to provide an additional peak efficiency point between output power back-off levels of −6 dB and 0 dB if the bias conditions of the second peak amplifier $10_2$ and the third peak amplifier $10_3$ are different.

The Doherty amplifier in FIG. 1 fundamentally assumes that the peak amplifiers, $10_1$ to $10_3$, are turned off in a smaller output power thereof. However, parasitic circuit components, such as capacitance caused between a drain and a source of a field effect transistor and/or inductance by bonding wires and that of package leads attributed in the peak amplifiers, may shift an open status of an output thereof so as to show substantial impedance. Accordingly, the design of the Doherty amplifier becomes simple by regarding the outputs of the peak amplifiers to be short-circuited when they are turned off were the output power thereof is less than the back-off region, and a Doherty amplifier thus designed may operate stably.

Figure 3:
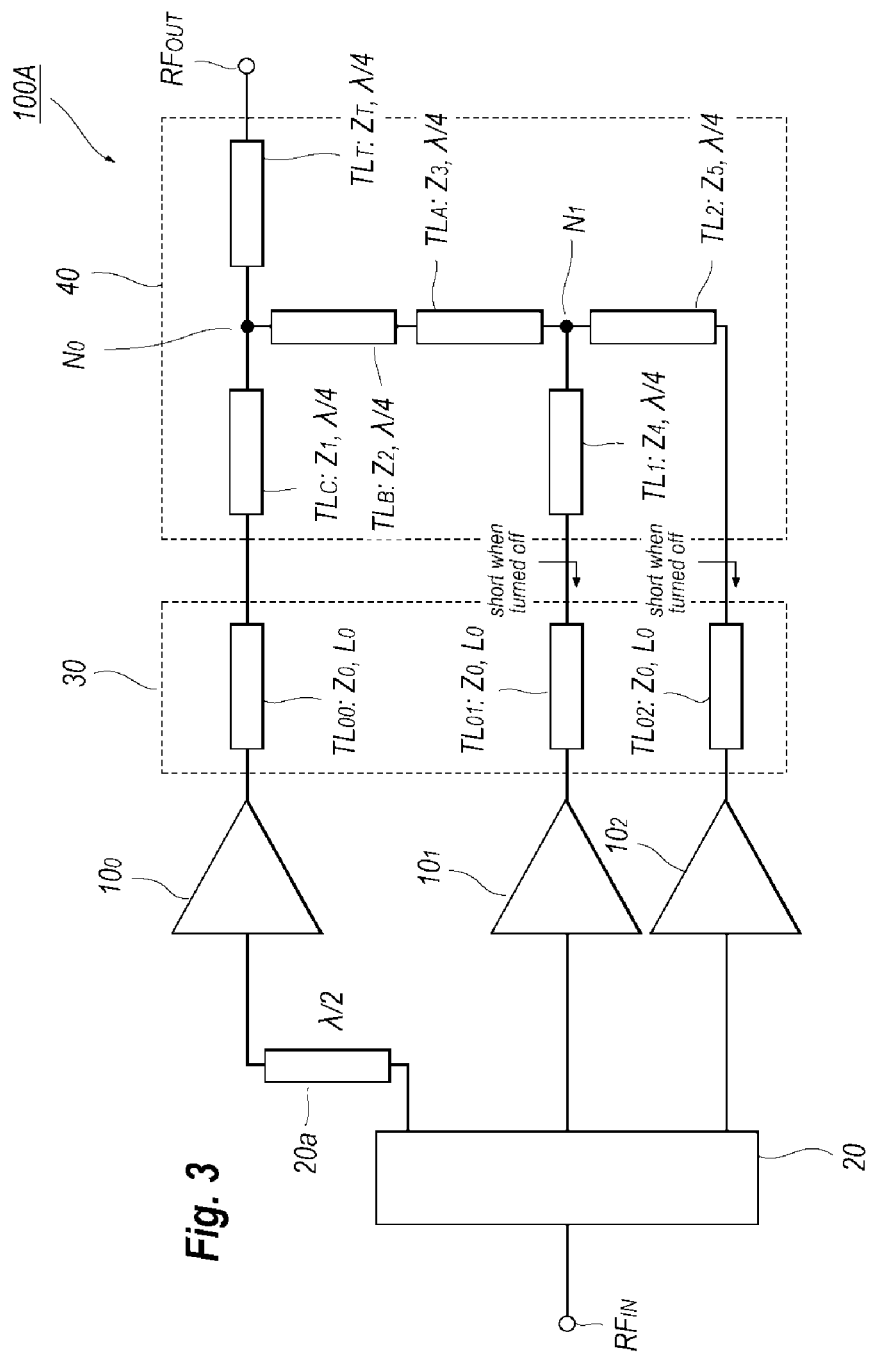
FIG. 3 shows a functional block diagram of a three-stage Doherty amplifier that implements three peak amplifiers.

FIG. 3 shows a functional block diagram of a three-stage Doherty amplifier 100A that includes an input splitter 20, a carrier amplifier $10_0$, two peak amplifiers, $10_1$ and $10_2$, an offset unit 30, and an output combiner 40. The offset unit 30 includes transmission lines, $TL_{00}$ to $TL_{02}$, in respective outputs of the carrier amplifier $10_0$ and the peak amplifiers, $10_1$ and $10_2$, where the transmission lines, $TL_{00}$ to $TL_{02}$, make the impedance at respective ends thereof connected with the output combiner 40 to be substantially short-circuited. The input splitter 20 evenly splits an input signal provided in the input terminal $RF_{IN}$ into three portions each provided with the carrier amplifier $10_0$ and the peak amplifies, $10_1$ and $10_2$, where the carrier amplifier $10_0$ receives one of three portions of the input signal with a delayed phase of 180° by a transmission line 20a with an electrical length of λ/2. The input splitter 20 may be a type of, for instance, Wilkinson power splitter.

The outputs of the amplifiers, $10_0$ to $10_2$, are provided to the output combiner 40 through the respective transmission lines, $TL_{00}$ to $TL_{02}$, each having characteristic impedance of $Z_0$ and an electrical length of $L_0$, where the impedance $Z_0$ is substantially equal to load impedance of the Doherty amplifier 100A and the electrical length $L_0$ is not always to be λ/4, or, generally different from λ/4. That is, the impedance $Z_0$ and the electrical length $L_0$ are determined such that the impedance seeing the output of the peak amplifiers, $10_1$ and $10_2$, become substantially the short circuit when the peak amplifiers, $10_1$ and $10_2$, turn off at small output power. Details of the transmission lines, $TL_{00}$ to $TL_{02}$, of a mechanism to make the impedance seeing the output of the peak amplifiers, $10_1$ and $10_2$, will be described later. Because the carrier amplifier $10_0$ and two peak amplifiers, $10_1$ and $10_2$, have the same configuration; they show the output impedance substantially same with other when they turn off. Accordingly, the transmission lines, $TL_{00}$ to $TL_{02}$, have the same arrangement. The Doherty amplifier 100A shown in FIG. 3 has three extrema in the efficiency thereof as shown in FIG. 2, and the maximum back-off becomes −9.5 dB from the saturated power.

In small output power where the two peak amplifiers, $10_1$ and $10_2$, turn off, the impedance seeing the respective peak amplifiers, $10_1$ and $10_2$, at the node $N_1$ becomes the open circuit because the outputs the offset transmission lines, $TL_{01}$ and $TL_{02}$, become the short circuit; accordingly, the outputs of two transmission lines, $TL_1$ and $TL_2$, become the open circuit because the transmission lines, $TL_1$ and $TL_2$, have the electrical length of λ/4. Then, the impedance seeing the node $N_1$ from the node $N_0$ becomes the open circuit because two transmission lines, $TL_A$ and $TL_B$, put between two nodes, $N_0$ and $N_1$, have electrical lengths of λ/4. Therefore, the arrangements from the transmission line $TL_B$ to the two peak amplifies, $10_1$ and $10_2$, show no contribution to the node $N_0$.

When the output terminal $RF_{OUT}$ is terminated with 50Ω, the impedance seeing the load connected with the output terminal $RF_{OUT}$ from the node $N_0$ becomes $Z_T^2/50$, and the impedance seeing the node $N_0$ from the output of the offset transmission line $TL_{00}$ becomes $Z_1^2/(Z_T^2/50)=(Z_1/Z_T)^2*50$. Adjusting the electrical length $L_0$, the characteristic impedance $Z_0$ of the transmission line $TL_{00}$, and a ratio of $Z_1/Z_T$, the load impedance of the carrier amplifier $10_0$ may be easily set to be several hundreds of ohms at small output power where only the carrier amplifier $10_0$ operates. The load impedance of several hundreds of ohms is popular in an ordinary Doherty amplifier.

Increasing the output power into the first back off region where the first peak amplifier $10_1$ turns on, the load impedance of the second peak amplifier $10_2$ is still open circuited, which means that the impedance seeing the second peak amplifier $10_2$ at the output of the offset transmission line $TL_{O2}$ is still regarded to be a short-circuited, but the impedance seeing the first peak amplifier $10_1$ at the output of the offset transmission line $TL_{O1}$ changes to a substance value. Under such a condition, the carrier amplifier $10_0$ in the output thereof couples with the node $N_0$ through the offset transmission line $TL_{00}$ and the transmission line $TL_C$, while, the first peak amplifier $10_1$ couples with the node $N_0$ through the offset transmission line $TL_{O1}$ and the transmission lines, $TL_1$, $TL_A$, and $TL_B$.

Because the carrier amplifier $10_0$ and the peak amplifiers, $10_1$ and $10_2$, have the same arrangement, they cause phase delays substantially equal to each other. Also, phase delays caused by the offset transmission lines, $TL_{00}$ and $TL_{01}$, are substantially equal to each other. Accordingly, the amplified signal coming from the peak amplifier $10_1$ delays by an amount corresponding to the electrical length of the transmission lines, $TL_1$, $TL_A$, and $TL_B$. Among the delays caused by those transmission lines, $TL_1$ to $TL_B$, the input transmission line 20a put upstream of the carrier amplifier $10_0$ may compensate contribution by the latter two transmission lines, $TL_A$ and $TL_B$, and the output transmission line TLC coupled with the offset transmission line $TL_{00}$ may compensate the contribution by the first output transmission line $TL_1$. Accordingly, the output coming from the carrier amplifier $10_0$ and that from the first peak amplifier $10_1$ couple at the combining node $N_0$ with the same phase, in other word, they are stably combined at the combining node $N_0$. Under such a condition, the second peak amplifier $10_2$ shows no contribution to the combining node $N_0$ because the output of the offset transmission line $TL_{02}$ may be regarded as the short circuit, and the impedance seeing the second peak amplifier $10_2$ at the node $N_1$ becomes the open circuit.

Further increasing the output power and the second peak amplifier $10_2$ begins to turn on in another back off region, the respective outputs are combined at the node $N_1$ through the first and second output transmission lines, $TL_1$ and $TL_2$, with the phase thereof different from the phase of the signal coming from the carrier amplifier $10_0$ at the node $N_0$ by $\pi$ because of the existence of the input transmission liner $20a$. Accordingly, at the combining node $N_0$, three outputs coming from the carrier amplifier $10_0$ and two peak amplifiers, $10_1$ and $10_2$, may combining with the phases equal to each other.

Figure 4:
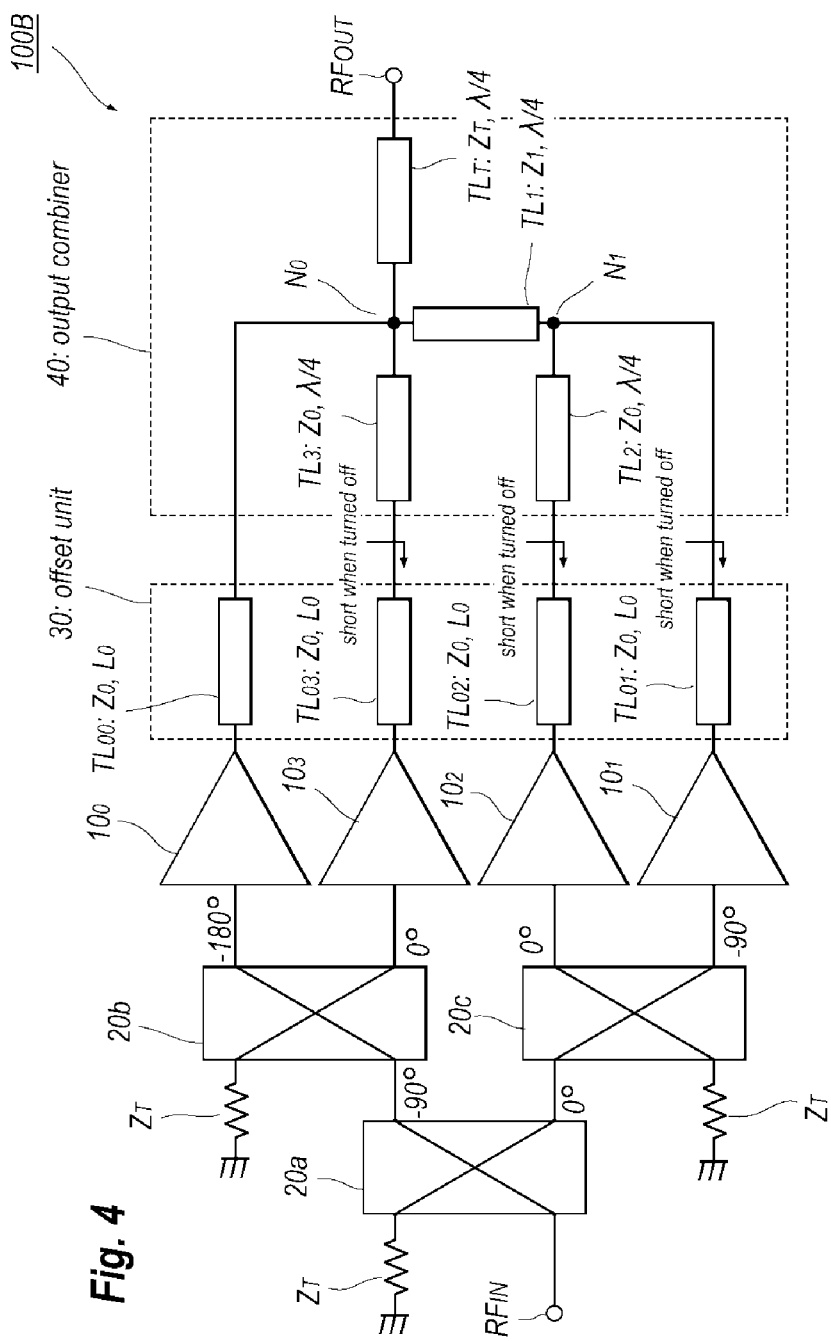
FIG. 4 shows functional block diagram of a four-stage Doherty amplifier that implements four peak amplifiers.

FIG. 4 shows a functional block diagram of a Doherty amplifier 100B according to an embodiment according to the present invention, where the Doherty amplifier 100B shown in FIG. 4 is a type of, what is called, inverted symmetrical four-stage Doherty amplifier. The RF signal input to the terminal $RF_{IN}$ is evenly split by two-stage 3 dB couplers, $20a$ to $20c$, into four portions. One of the outputs of a 3 dB coupler, which is directly connected with the input terminal thereof, delays a phase thereof by 90° with respect to a phase of another signal output from the other output. Accordingly, the RF signal input to the carrier amplifier $10_0$ delays the phase thereof by 180° from the phase of the input signal at the input terminal $RF_{IN}$ and the power becomes a quarter thereof. The RF signal input to the first peak amplifier $10_1$ delays the phase thereof by 90°, that input to the second peak amplifier $10_2$ has the phase with no delay, and that input to the third peak amplifier delays the phase by 90°.

The outputs of the carrier amplifier $10_0$ and the peak amplifiers, $10_1$ to $10_3$, enter the output combiner 40 through the respective offset transmission lines, $TL_{O0}$ to $TL_{O3}$, in the offset unit 30. The offset transmission lines, $TL_{O0}$ to $TL_{O3}$, have the characteristic impedance of $Z_0$ and the electrical length of $L_0$ that is usually shorter than $\lambda/4$.

The output combiner 40 may combine the output of the carrier amplifier $10_0$ and with the outputs of the peak amplifiers, $10_1$ to $10_3$, through the combining transmission lines, $TL_1$ to $TL_3$. That is, the output of the first peak amplifier $10_1$ couples with the combining node $N_0$ through the first combining transmission line $TL_1$, that of the second peak amplifier $10_2$ couples with the combining node $N_0$ through the first and second combining transmission lines, $TL_1$ and $TL_2$, and that of the third peak amplifier $10_3$ couples with the combining node $N_0$ through the third combining transmission line $TL_3$. Because the RF signal input to the carrier amplifier $10_0$ delays by 180° from that at the input terminal $RF_{IN}$, the output signal coming from the carrier amplifier $10_0$ further delays by the carrier amplifier $10_0$ itself and the carrier offset transmission line $TL_{O0}$ at the combining node $N_0$.

As to the first peak amplifier $10_1$, the signal input thereto delays by 90°, that is the signal input thereto advances the phase thereof by 90° with respect to the signal input to the carrier amplifier $10_0$. Because the output of the first carrier amplifier $10_1$ couples with the combining node $N_0$ through the first combining transmission line $TL_1$ with an electrical length of $\lambda/4$ that generates a phase delay of 90°. Accordingly, the output of the first peak amplifier $10_1$ appears at the combining node $N_0$ with a total phase delay, with respect to the signal at the input terminal $RF_{IN}$, of 90° by the input 3 dB couplers, the peak amplifier $10_1$ itself, the first offset transmission line $TL_{O1}$, and the first combining transmission line $TL_1$. Accordingly, the output signal coming from the first peak amplifier $10_1$ arrives at the combining node $N_0$ with the phase that is matched with the phase of the signal coming from the carrier amplifier $10_0$.

The second peak amplifier $10_2$ receives the input signal from the input terminal $RF_{IN}$ with substantially no delays at the input 3 dB couplers, $20a$ and $20c$, which means that the signal input thereto advances the phase thereof by 180° with respect to the signal input to the carrier amplifier $10_0$. Besides, the output of the second peak amplifier $10_2$ couples with the combining node $N_0$ through the combining transmission lines, $TL_2$ and $TL_1$, each having the electrical lengths of $\lambda/4$, which causes the phase delay of 180°. Accordingly, the output of the second peak amplifier $10_2$ reaches the combining node $N_0$ with the phase substantially equal to the phase of the output coming from the carrier amplifier $10_0$.

The third peak amplifier $10_3$, which receives the signal delayed by 90° by the input 3 dB couplers, $20a$ and $20b$, couples the output thereof with the combining node $N_0$ through the third combining transmission line $TL_3$ with an electrical length of $\lambda/4$ that causes the phase delay of 90°. Accordingly, the third peak amplifier $10_3$ in the output thereof may couple with the output of the carrier amplifier $10_0$ with the phase equal to each other. Thus, the outputs of the peak amplifiers, $10_1$ to $10_3$, may couple with the combining node $N_0$ with the phase equal to the phase of the carrier amplifier $10_0$.

Figure 5A:
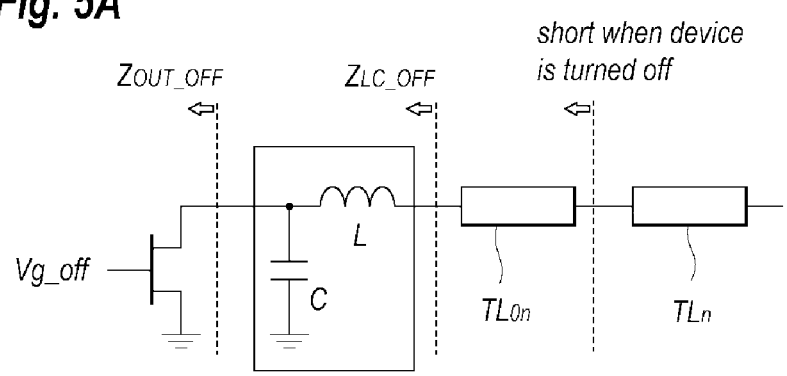
FIG. 5A schematically shows a circuit diagram of an offset unit for a carrier amplifier and a peak amplifier.

A relation of the impedance of the output combiner will be described. In a lower output power where only the carrier amplifier $10_0$ operates, all of the peak amplifiers $10_1$ to $10_3$ turn off so as to show output impedance thereof large enough but strictly not regarded as an open circuit. For instance, when the peak amplifiers, $10_1$ to $10_3$, are configured with respective field effect transistor (FET), a junction capacitor between the drain and the source thereof, parasitic inductance due to bonding wires wire-boned with the drain electrode, and so on makes the output impedance not to be an open circuit. FIG. 5A schematically illustrates a primary portion of a circuit diagram around an FET implemented within the amplifiers, $10_0$ to $10_3$, while, FIG. 5B indicates a smith chart of the circuit shown in FIG. 5A.

Figure 5B:
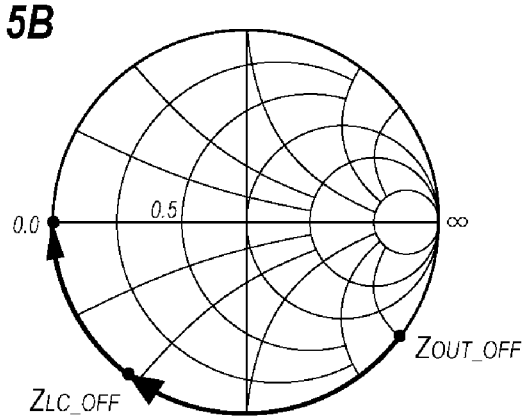
FIG. 5B shows an impedance behavior of the offset unit shown in FIG. 5A.

The FET in the amplifier inevitably accompanies with the junction capacitance between the drain and the source and the inductance due to the bonding wire to extract an output from the drain. Assuming the output impedance of the FET seeing the inside at the drain thereof to be $Z_{OUT\_OFF}$, this impedance $Z_{OUT\_OFF}$ shifts from the open circuit $\infty$ on the smith chart as shown in FIG. 5B. The FET in the drain thereof couples with a matching circuit including, for instance, a capacitor C and an inductor L, where the capacitance C in FIG. 5A is not the junction capacitance between the drain and the source of the FET but the inductor L corresponding to the inductance attributed to the bonding wire connected between the drain of the FET and the offset transmission line. The matching circuit moves, or rotates clockwise from the $Z_{OUT\_OFF}$ to the $Z_{LC\_OFF}$, that is, the impedance $Z_{LC\_OFF}$ corresponds to impedance seeing the FET at the end of the offset transmission line $TL_{ON}$.

The offset transmission lines, $TL_{O0}$ to $TL_{O3}$, in the offset unit 30 have the electrical length corresponding to rotate the point $Z_{LC\_OFF}$ to the short circuit (Z=0). Because the point $Z_{LC\_OFF}$ positions in the edge on the smith chart, the offset transmission lines, $TL_{O0}$ to $TL_{O3}$, have the characteristic impedance of $Z_0$, and the electrical length L0 so as to rotate from the point $Z_{LC\_OFF}$ to the short circuit (Z=0) in the left end, where an example shown in FIG. 5B has the electrical length about $\lambda/16$.

Thus, the LC matching circuit and the offset transmission line may set the impedance seeing the amplifier at the end of the offset transmission line to be a short circuit. Accordingly, further connecting a combining transmission line that has the electrical length of λ/4 with the end of the offset transmission line, the impedance seeing the amplifier at the end of the combining transmission line may be an open circuit.

In a case where the carrier amplifier $10_0$ and the peak amplifiers, $10_1$ to $10_3$, saturate the output power thereof and the output terminal $RF_{OUT}$ is terminated by a load of 50Ω, the all amplifiers, $10_0$ to $10_3$, see the output impedance of 50Ω. Accordingly, the composite impedance at the combining node $N_0$ becomes 12.5Ω. The output transmission line $TL_T$ is necessary to covert this composite impedance of 12.5Ω to the load impedance 50Ω; accordingly, the characteristic impedance thereof becomes 25Ω.

In a small output power where only the carrier amplifier $10_0$ becomes active, the LC matching circuit shown in FIG. 5A is set such that the impedance seeing the carrier amplifier $10_0$ at the combining node $N_0$ becomes 12.5Ω. Similarly, when the carrier amplifier $10_0$ and the first peak amplifier $10_1$ saturate but the rest two peak amplifiers, $10_2$ and $10_3$, still turn off, the impedance seeing the carrier amplifier $10_0$ and that seeing the first peak amplifier $10_1$ at the combining ode $N_0$ become 25Ω. Similar conditions are considered for cases when the carrier amplifier $10_0$ and two peak amplifiers, $10_1$ and $10_2$, saturate but the last peak amplifier $10_3$ still turn off; and all amplifies, $10_0$ to $10_3$, saturate.

Figure 6:
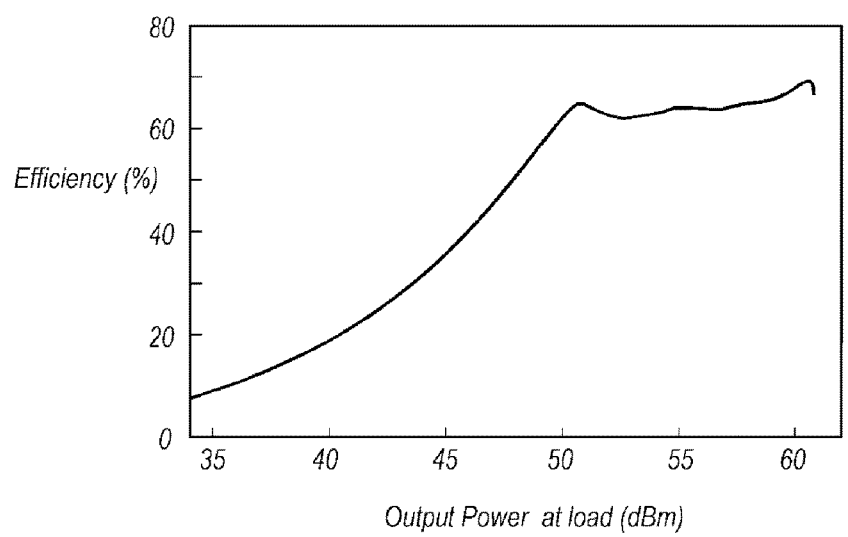
FIG. 6 shows an output performance of the Doherty amplifier shown in FIG. 4.

FIG. 6 shows the efficiency of the inverted four-stage Doherty amplifier 100B shown in FIG. 4 with respect to the output power monitored at the output terminal $RF_{OUT}$. The back off of −12 dB is observed at the output power of 50 dBm and the efficiency of the Doherty amplifier 100B exceeds 60%. Only the carrier amplifier operates until the output power of 50 dBm, and the peak amplifiers sequentially turn on from the output power 50 to 62 dBm, and no substantial reduction of the efficiency is observed.

While several embodiments and variations of the present invention are described in detail herein, it should be apparent that the disclosure and teachings of the present invention will suggest many alternative designs to those skilled in the art.

What is claimed is:

1. A Doherty amplifier including a carrier amplifier and a plurality of peak amplifiers, comprising:
    an input splitter that evenly distributes an input radio frequency (RF) signal to the carrier amplifier and the plurality of peak amplifiers;
    an amplifying unit that includes the carrier amplifier and the plurality of peak amplifiers;
    an offset unit that includes a plurality of offset transmission lines each connected with the carrier amplifier and the peak amplifiers; and
    an output combiner that combines outputs of the carrier amplifier and the peak amplifiers each provided through the offset transmission lines;
    wherein the offset transmission lines have characteristic impedance and electrical lengths substantially equal to each other, the offset transmission lines convert output impedance of the peak amplifiers into a short-circuit when the peak amplifiers are turned off.

2. The Doherty amplifier according to claim 1,
    wherein the peak amplifiers include a first peak amplifier, a second peak amplifier, and a third peak amplifier,
    wherein the offset transmission lines includes a carrier offset transmission line connected with the carrier amplifier, a first offset transmission line, a second offset transmission line, and a third offset transmission line, the first to third offset transmission lines being connected with the first to third peak amplifiers, respectively,
    wherein the output combiner includes a combining node that is coupled with the carrier offset transmission line directly, with the first offset transmission line indirectly through a first combining transmission line with an electrical length of λ/4, with the second offset transmission line indirectly through the first combining transmission line with an electrical lend of λ/4 and a second combining transmission line with an electrical length of λ/4, and with the third offset transmission line indirectly through a third combining transmission line with an electrical length of λ/4, where λ is a wavelength of the input RF signal.

3. The Doherty amplifier according to claim 2,
    wherein the output combiner includes an output transmission line connected between the combining node and an output terminals of the Doherty amplifier, the output transmission line having an electrical length of λ/4.

4. The Doherty amplifier according to claim 3,
    wherein the carrier offset transmission line, the first to third offset transmission lines, and the second third combining transmission lines have characteristic impedance substantially equal to load impedance of the Doherty amplifier, and
    wherein the output transmission line and the first combining transmission line have characteristic impedance substantially equal to a half of the load impedance.

5. The Doherty amplifier according to claim 2,
    wherein the Doherty amplifier has a back off range of 12 dB.

6. The Doherty amplifier according to claim 1,
    wherein the carrier amplifier and the peak amplifiers have configurations substantially equal to each other.

* * * * *